United States Patent [19]
Tsuda et al.

[11] Patent Number: 5,355,885
[45] Date of Patent: Oct. 18, 1994

[54] ILLUMINATING METHOD AND APPARATUS IN NUCLEAR MAGNETIC RESONANCE INSPECTION

[75] Inventors: Munetaka Tsuda, Mito; Atsushi Takane; Masao Yabusaki, both of Katsuta, all of Japan

[73] Assignee: Hitachi Medical Corporation, Tokyo, Japan

[21] Appl. No.: 988,889

[22] Filed: Dec. 10, 1992

[30] Foreign Application Priority Data

Dec. 12, 1991 [JP] Japan .................................. 3-329165

[51] Int. Cl.$^5$ ............................................ A61B 5/055
[52] U.S. Cl. .............................. 128/653.2; 128/653.5; 324/309; 324/322
[58] Field of Search .......................... 128/653.2, 653.5; 324/309, 318, 322

[56] References Cited

U.S. PATENT DOCUMENTS

| | | | |
|---|---|---|---|
| 4,804,261 | 2/1989 | Kirschen | 351/158 |
| 4,878,499 | 11/1989 | Suzuki et al. | 128/653.2 |
| 4,901,141 | 2/1990 | Costello | 128/653.2 |
| 4,981,137 | 1/1991 | Kondo et al. | 128/653.2 |
| 5,076,275 | 12/1991 | Bechor et al. | 128/653.2 |
| 5,134,373 | 7/1992 | Tsuruno et al. | 324/309 |

Primary Examiner—Ruth S. Smith
Attorney, Agent, or Firm—Antonelli, Terry, Stout & Kraus

[57] ABSTRACT

In an illuminating method for nuclear magnetic resonance inspection, the progress of inspection is visually informed to a patient so that the patient can easily and surely keep himself or herself at rest during a scanning period, thereby improving accuracy of the inspection and allowing the patient to feel more at ease. Control signals indicating the progress of inspection are supplied from a control circuit to an illumination control circuit. The illumination control circuit changes, based on the control signals, the intensity, color, etc. of light emitted from a magnet cavity illuminating panel in accordance with the progress of inspection. It is thus possible to visually inform the patient of the progress of inspection, improve accuracy of the inspection, and illuminate a magnetic field generating space for suppressing a feeling of uneasiness felt by the patient.

24 Claims, 13 Drawing Sheets

ILLUMINATING METHOD AND APPARATUS IN NUCLEAR MAGNETIC RESONANCE INSPECTION

BACKGROUND OF THE INVENTION

The present invention relates to an illuminating method and apparatus in nuclear magnetic resonance inspection, and more particularly to an illuminating method and apparatus in nuclear magnetic resonance inspection in which a density distribution and a relaxation time of particular nuclei (e.g., a hydrogen nucleus and a phosphorus nucleus) of individual tissues in a living body are measured by utilizing a nuclear magnetic resonance phenomenon without invasion to obtain information for medical diagnosis.

Heretofore, X-ray CTs and ultrasonographs have widely been used as apparatuses for inspecting the internal structure of the human body in a non-destructive manner. In recent years, by utilizing a nuclear magnetic resonance phenomenon, it has become possible to obtain substantial medical diagnosis information that could not be provided by X-ray CTs and ultrasonographs.

For identifying signals from an object to be inspected (or a patient) separately for each of individual parts, an inspection apparatus utilizing a nuclear magnetic resonance phenomenon employs a method of applying a gradient magnetic field and a radio frequency magnetic field so as to make frequency and phase changes of the resulting resonance signal correspond to position information.

One most commonly used example of such a method is known as a spin-echo method. FIG. 13 shows a scanning sequence of the spin-echo method. In FIG. 13, a radio frequency magnetic field 45 and a gradient magnetic field 46 for slicing are applied to determine a particular slice plane, and a phase encode gradient magnetic field 47 and a frequency encode gradient magnetic field 48 are applied to obtain two-dimensional information in the slice plane, thereby measuring a nuclear magnetic resonance signal 49. To obtain one image, it is necessary to change a value of the phase encode gradient magnetic field 47 and repeat such a change 128 or 256 times. A repetition period 50 for this is generally set to a value in the range of about 0.3 second to about 3 seconds, and is an important parameter for a capability of tissue identification in view of a relaxation time of nuclear spins in the body tissues. Taking into account a signal time averaging scheme intended to improve the S/N ratio of the signal a train of scanning time values are distributed over a wide range from about 38 seconds to 20 minutes. Depending on the case, because inspection is conducted while shifting the slice plane or using a plurality of parameters, an inspection time for one patient may exceed one hour. If the patient moves during the inspection time an inconsistency occurs in position information of the image data and image artifacts appear on the reproduced image. As a result, a diagnosis capability may remarkably be lowered, or the positional relationship between images may be not clear.

When inspection is conducted using a nuclear magnetic resonance inspection apparatus, uniformity of a static magnetic field is required to be on the order of about 10 ppm so that image distortion will not be detrimental to diagnosis. While a superconducting magnet built up by solenoid coils can be used to achieve a static magnetic field with such a uniformity, it has a length almost twice its inner diameter and hence has a narrow, long tubular shape. This means that the patient is transported into a narrow, long inspection space within the superconducting magnet when inspected. Accordingly, there is a concern that the patient may feel uneasy in the closed and dark environment when transported into the inspection space under inspection. If the patient moves during inspection upon feeling uneasy, image artifacts appear and a diagnosis capability is remarkably lowered, as mentioned above.

Therefore, movements of the patient under inspection have conventionally been suppressed by not only fixing the patient's body by straps on the like so that locations to be inspected will not move during the long inspection time, but also by indicating the remaining scanning time to the patient to suppress a feeling of uneasiness felt by the patient.

As disclosed in JP-A-145643, it is known in the prior art to use optical fibers serving as light conductors to illuminate the inspection space with an even intensity of illumination and comfortable color light to make the patient free from anxiety. The above reference further suggests that to inform the patient of a period of time in which he or she must be at rest, the illumination may be turned on only for such a period of time, or that the illumination may be blinked as a sign for indicating the start of scanning.

Further, JP-A-3-47234 and JP-A-3-29638 disclose nuclear magnetic resonance inspection apparatuses which correspond to the prior art described above.

SUMMARY OF THE INVENTION

Meanwhile, the above-stated inspection time is not in whole allocated to scanning, but includes pretreatment for scanning, pauses and so forth. Of the inspection time, it is an actual scanning time during which the patient must surely be at rest. Accordingly, if information about what inspecting operation is going on at present can be informed to the patient from time to time, this would allow the patient to keep himself or herself surely at rest during the actual scanning time, while mitigating a burden imposed on the patient and improving accuracy of the inspection.

As mentioned above, however, the conventional nuclear magnetic resonance inspection apparatuses are only provided with means for simply informing the remaining scanning time, illuminating only for a period of time in which the patient must be at rest, or blinking the illumination as a sign for indicating the start of scanning, and cannot inform the patient of what inspecting operation is going on from time to time.

A need has therefore been felt for an illuminating method and apparatus in nuclear magnetic resonance inspection which can inform the patient of what inspecting operation is going on from time to time. Particularly, utilizing optical devices and light as informing devices is advantageous in that the light can be presented directly to the patient and also used for illumination.

An object of the present invention is to provide an illuminating method and apparatus in nuclear magnetic resonance inspection by which a patient can be kept from undesired movements, the progress of inspection in an inspection apparatus can be informed to the patient, and further an inspection space can be illuminated simultaneously.

To achieve the above object, the illuminating method and apparatus in nuclear magnetic resonance inspection according to the present invention are provided as follows.

The illuminating method in nuclear magnetic resonance inspection according to the present invention comprises the steps of:

generating a static magnetic field, a gradient magnetic field and a radio frequency magnetic field in a predetermined space, and detecting a nuclear magnetic resonance signal generated from an inspection object which is positioned in the predetermined space;

controlling an operation of generating the static magnetic field, gradient magnetic field and radio frequency magnetic field, and an operation of detecting the nuclear magnetic resonance signal;

illuminating the space in which the static magnetic field, gradient magnetic field and radio frequency magnetic field are generated, corresponding to an operation of nuclear magnetic resonance inspection;

processing the detected nuclear magnetic resonance signal through arithmetic operations; and displaying a result of the arithmetic operations in the processing step.

In the above illuminating method, preferably the intensity of light illuminating the space is stepwise changed corresponding to the operation of nuclear magnetic resonance inspection. As an alternative, the light illuminating the space has a plurality of wavelengths and the spectrum intensity at each wavelength is stepwise changed corresponding to the operation of nuclear magnetic resonance inspection. Alternatively, an area illuminated by the light in the space is stepwise changed corresponding to the operation of nuclear magnetic resonance inspection.

An illuminating apparatus in nuclear magnetic resonance inspection according to the present invention comprises:

a magnetic field generating device for respectively generating a static magnetic field, a gradient magnetic field and a radio frequency magnetic field;

a signal detecting device for detecting a nuclear magnetic resonance signal from an object to be inspected;

a magnetic field generation control device for controlling operations of said magnetic field generating device;

a light emitting device for illuminating a space in which the static magnetic field, gradient magnetic field and radio frequency magnetic field are generated, corresponding to an operation of nuclear magnetic resonance inspection;

a processing device for processing a detection signal from the signal detecting means through arithmetic operations; and a display device for displaying a result of the arithmetic operations in the processing device.

In the above illuminating apparatus, preferably the intensity of light emitted from the light emitting device is stepwise changed corresponding to the operation of nuclear magnetic resonance inspection. As an alternative, the light emitted from the light emitting device has a plurality of wavelengths and the spectrum intensity at each wavelength is stepwise changed corresponding to the operation of nuclear magnetic resonance inspection. Alternatively, a light emitting area of the light emitting device is stepwise changed corresponding to the operation of nuclear magnetic resonance inspection.

Also, in the above illuminating apparatus, preferably the light emitting device comprises a plurality of light emitting diodes which are disposed in the above-mentioned space and are able to emit light in plural colors, and the intensities and color tones of light emitted by a plurality of the light emitting diodes are stepwise changed corresponding to the operation of nuclear magnetic resonance inspection.

Further, in the above illuminating apparatus, preferably the light emitting device comprises electroluminescent lamps disposed in the above-mentioned space.

Finally, in the above illuminating apparatus, preferably the light emitting device comprises luminous sources which are disposed outside the above-mentioned space and able to emit light in plural colors, and light in a mixed color of the plural colors of the light emitted from the luminous sources illuminates the above-mentioned space.

With the illuminating method in nuclear magnetic resonance inspection according to the present invention, messages about the progress of inspection are informed to a patient lying in an inspection space by using the light from the light emitting device. The light emitting operation of the light emitting device is controlled by control signals indicating the progress of inspection. Based on the control signals, the intensity, color, etc. of light emitted from the light emitting device are changed in accordance with the progress of inspection. This allows a patient to visually notice the progress of inspection and surely keep himself or herself at rest during the inspection, with the result of that accuracy of the inspection can be improved and a magnetic field generating space is illuminated to suppress a feeling of uneasiness felt by the patient.

DETAILED DESCRIPTION OF THE PREFERRED EMBODIMENTS

Hereinafter, preferred embodiments of the present invention will be described with reference to the accompanying drawings.

Figure 1:
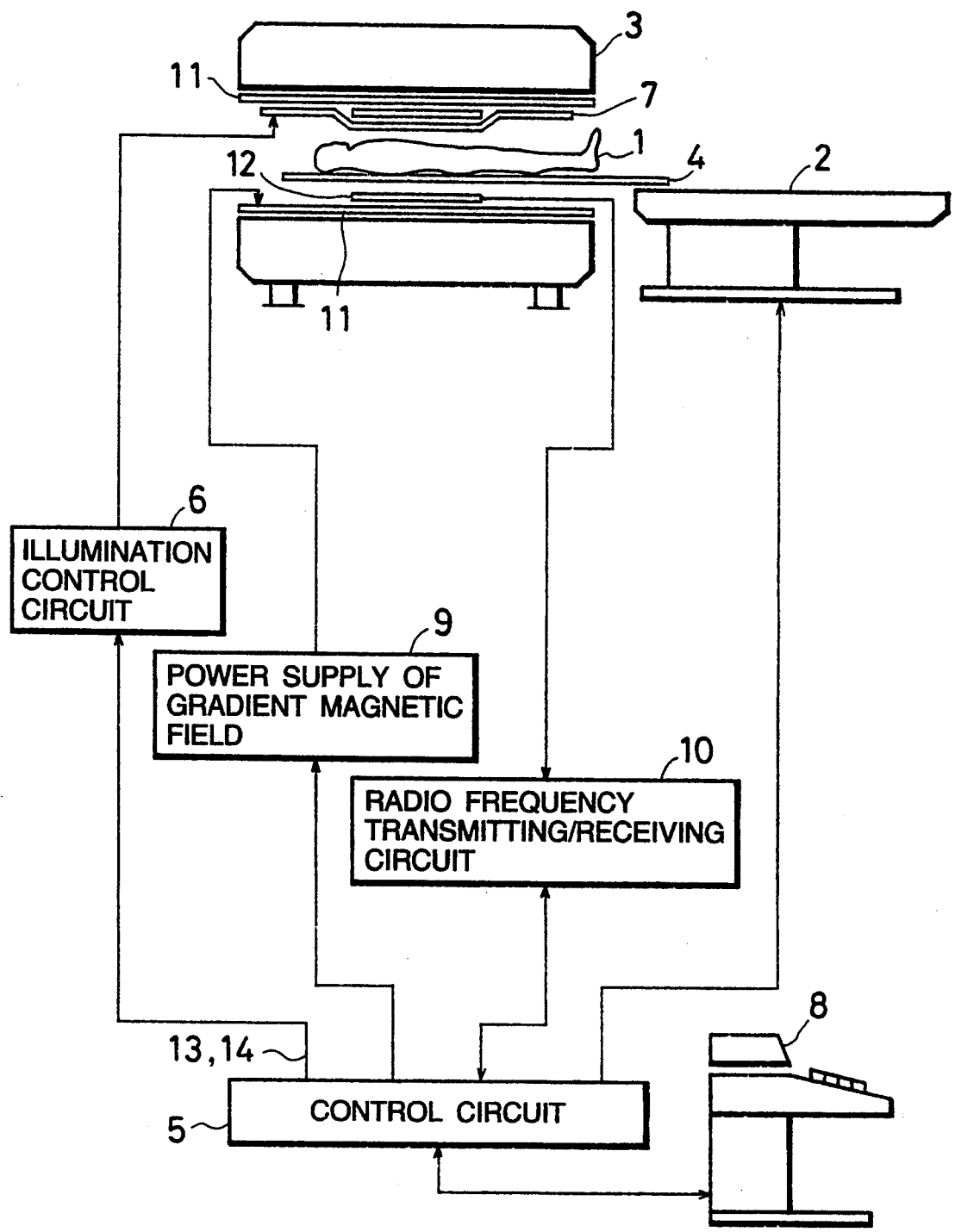
FIG. 1 is a schematic view showing an arrangement of a nuclear magnetic resonance inspection apparatus to which is applied an illuminating method according to a first embodiment of the present invention.
Figure 2:
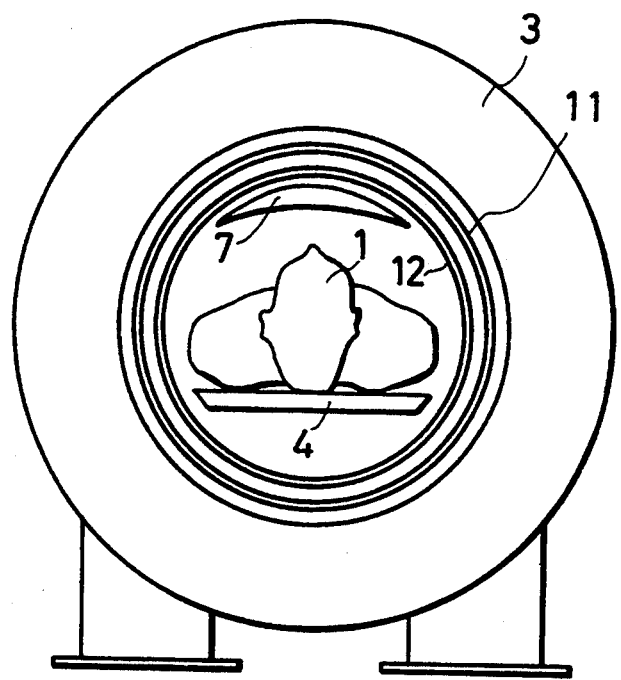
FIG. 2 is a view of a superconducting magnet 3 in FIG. 1 as viewed from the side of a left end face.

FIG. 1 is a schematic view showing an arrangement of a nuclear magnetic resonance inspection apparatus to which is applied an illuminating method according to a first embodiment of the present invention and in which a slice image in the abdomen of a patient 1 is to be shot or scanned. FIG. 2 is a view of a superconducting magnet 3 in FIG. 1 as viewed from the side of its left end face.

In FIGS. 1 and 2, first, the patient 1 lies face up on a cradle 4 of a patient table 2 and is moved together with the cradle 4 by a cradle moving mechanism (not shown) so that the patient's abdomen to be inspected is nearly aligned with the center of the superconducting magnet 3. To move the cradle 4, a control circuit 5 supplies the patient table 2 with a control signal for moving the cradle. The control circuit 5 also supplies control signals 13, 14 to an illumination control circuit 6. Based on the control signals 13, 14, the illumination control circuit 6 controls a magnet cavity illuminating panel 7, which comprises a plurality of light emitting diodes each having a relatively large light emitting area as described later, so that light of a predetermined color illuminates a cavity inside the magnet with almost the same brightness as in the room. In the embodiment shown in FIG. 1, the magnet cavity illuminating panel 7 is installed to cover a wide area above the patient 1.

Then, an operator (not shown) depresses keys on an operator console 8 to adjust the actuation timing and intensity of a gradient magnetic field and a radio frequency magnetic field for each patient so that a highest quality image is obtained. More specifically, the control circuit 5 actuates a power supply 9 of gradient magnetic field and a radio frequency transmitting/receiving circuit 10 to supply currents to a gradient magnetic field coil 11 and a radio frequency coil 12, each including X, Y and Z coils, for respectively generating a gradient magnetic field and a radio frequency magnetic field. Then, a nuclear magnetic resonance signal from the abdomen region of the patient 1 is detected by the radio frequency transmitting/receiving circuit 10 and supplied to the control circuit 5 after amplification and demodulation. A processing unit (not shown) in the control circuit 5 performs various arithmetic operations on the signal supplied thereto for calculating and correcting adjustment data of the respective magnetic field generating device. As a result, the actuation timing and intensity of the gradient magnetic field and the radio frequency magnetic field are adjusted for each patient. Such an adjusting period is usually on the order of 1 to 2 minutes. During the adjusting period, the control circuit 5 supplies the illumination control circuit 6 with a signal indicating that the apparatus is in the adjusting period. Based on this signal, the illumination control circuit 6 changes the intensities and/or color tones of light emitted from-the magnet cavity illuminating panel 7, as described later.

After the above adjustment is completed, the operator manipulates the operator console 8 again for making the inspection proceed step by step. Correspondingly, the control circuit 5 supplies the illumination control circuit 6 with a signal indicating the progress of inspection. Based on this supplied signal indicating the progress of inspection, the illumination control circuit 6 changes the intensities and/or color tones of light emitted from the magnet cavity illuminating panel 7, as described later.

After all steps of the inspection are completed, the operator manipulates the operator console 8 to move the cradle 4 of the patient table out of the superconducting magnet 3.

In the above arrangement, the control circuit 5 comprises a computer and performs the functions of performing various types of control for measurement, processing measured signals, and transferring control signals related to the inspection to the illumination control circuit 6.

As shown in FIG. 2, the magnet cavity illuminating panel 7 is configured to be able to entirely illuminate the cavity inside the magnet. Thus, wherever the body part of the patient 1 is located, various messages can be presented to (or perceived by) the patient 1 using light. The present invention is arranged such that the patient is provided with information about the progress (or state) of a measuring operation going on in the inspection apparatus.

Figure 3:
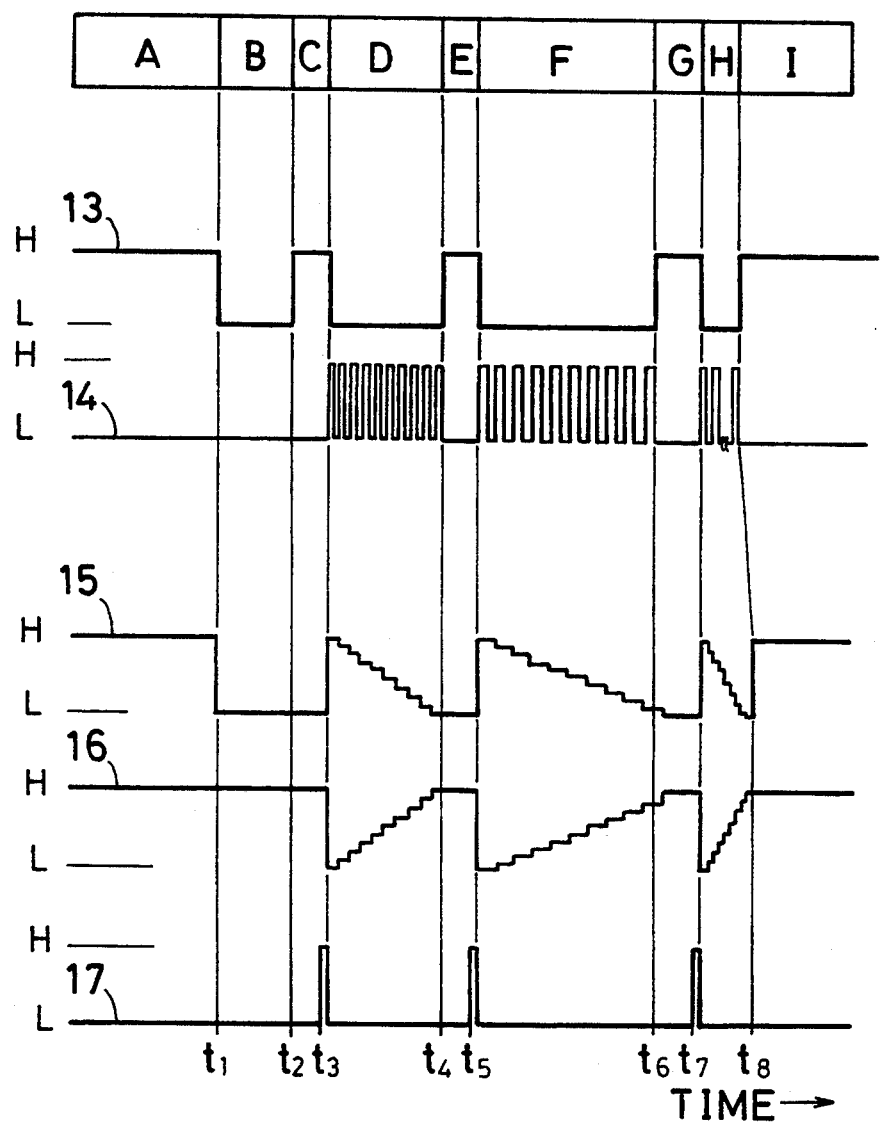
FIG. 3 is a timing chart showing the relationship between the progress of inspection and operation of an illumination control circuit according to the first embodiment of the present invention.
Figure 4:
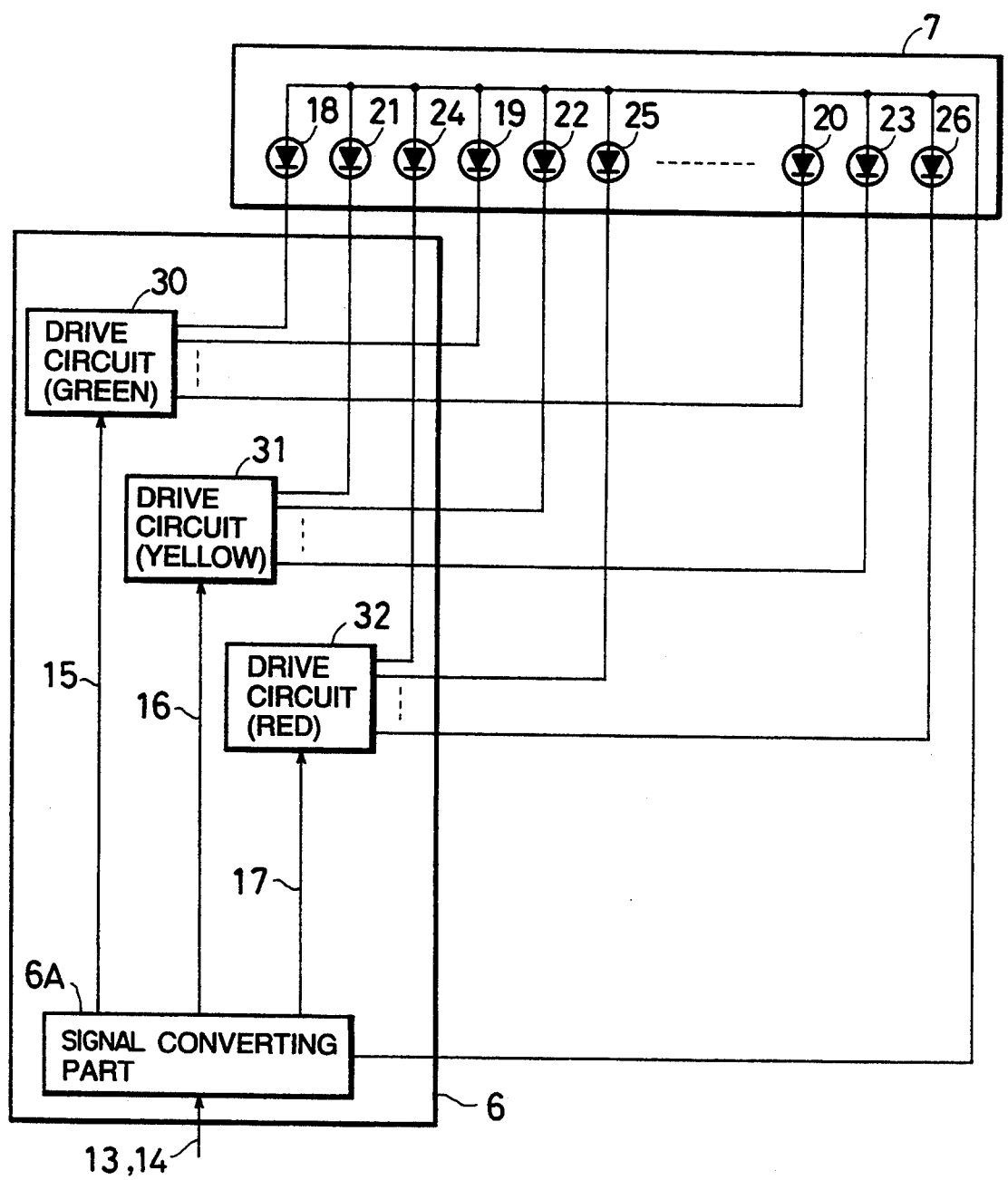
FIG. 4 is a diagram showing details of a connection between the illumination control circuit and a magnet cavity illuminating panel.

FIG. 3 is a timing chart showing the relationship between the progress of inspection and operation of the illumination control circuit 6, and FIG. 4 is a diagram showing details of a connection between the illumination control circuit 6 and the magnet cavity illuminating panel 7.

In FIG. 4, a signal converting part 6A is arranged to supply, based on signals 13, 14 applied from the control circuit 5, a signal 15 to a green light emitting diode drive circuit 30, a signal 16 to a yellow light emitting diode drive circuit 31, and a signal 17 to a red light emitting diode drive circuit 32. On the other hand, the magnet cavity illuminating panel 7 comprises a number of diodes, e.g., ten for each color; namely, planar green light emitting diodes 18, 19, 20, . . . , planar yellow light emitting diodes 21, 22, 23, . . . , and planar red light emitting diodes 24, 25, 26, . . . . These light emitting diodes each have a planar light emitting region of relatively large area. The drive circuit 30 performs on/off control of ten units of the planar green light emitting diodes 18, 19, 20, . . . based on the signal 15. The drive circuit 31 performs on/off control of ten units of the planar yellow light emitting diodes 21, 22, 23, . . . based on the signal 16. Further, the drive circuit 32 performs on/off control of ten units of the planar red light emitting diodes 24, 25, 26, . . . based on the signal 17.

Referring to FIGS. 3 and 4, a period A until time t1 represents a process in which the patient 1 is transported into the inspection space. During the period A, the signal 13 takes an "H" level, the signal 14 takes an "L" level, the signal 15 and the signal 16 take an "H" level, and the signal 17 takes an "L" level. In other words, the green and yellow light emitting diodes are all turned on and the red light emitting diodes are all turned off. Then, a period B until time t2 represents a process of pretreatment in which the signal 13 turns to an "L" level and the signal 15 turns to an "L" level. In other words, only the yellow light emitting diodes are all turned on. A next period C until time t3 represents a pause process in which the signal 13 turns to an "H" level, but all the other signals remain at the same level. A period D until time t4 represents a process of scanning in which the signal 13 turns to an "L" level and the signal 14 is provided with a predetermined number of pulse signals, such as ten. In response to the pulse signals of the signal 14, the level of the signal 15 decreases in 10 steps from an "H" level to an "L" level, while the level of the signal 16 increases in 10 steps from an "L" level to an "H" level. Further, the signal 17 turns to an "H" level for a short time immediately after the end of the period C. In other words, concurrently with the start of the period D, the red light emitting diodes are all turned on for a short time. The green light emitting diodes are turned off one by one, for instance, from the state where all are turned on, and are finally all turned off at the end of the period D (for controlling the number of diodes turned on). On the contrary, the yellow light emitting diodes are turned on one by one from the state where all are turned off, and are finally all turned on at the end of the period D. A period E until time t5 represents a pause process as in the period C in which the signals take the same levels as those in the period C. A period F until time t6 represents a process of scanning as in the period D. In the period F, however, the entire period and the duration of each level step are longer than those in the period D. Subsequently, a period G until time t7 represents a pause process and a period H until time t8 represents a process of scanning. A period I after time t8 represents a process in which the patient is transported out of the inspection space and the signals take the same levels as those in the period A.

The above-explained progress of inspection is as follows when viewed from changes in color of the light illuminating the inspection space. First, when the patient 1 is transported from the outside of the superconducting magnet 3 to its cavity (period A), the cavity is entirely illuminated in a mixed color of yellow and green with maximum brightness. Accordingly, the inspection space is bright so as to keep the patient from feeling uneasy. The pretreatment period B then begins. During this period, the inspection space is illuminated by the yellow light. In the first pause period C subsequent to the period B, too, the yellow illumination continues. Entering the period D in which the first scanning is performed, the red light momentarily flashes with maximum brightness at the start of the period D. At the same time, the yellow light disappears and the green light is illuminated with maximum brightness. During the period D, the inspection space is illuminated in a mixed color of yellow and green and, as the scanning proceeds, the illumination color changes from green to yellow. When the green light completely disappears and the yellow light is illuminated with maximum brightness, this corresponds to the state where the scanning is ended, followed by the pause period E. After that, the scanning is repeated twice in a similar fashion to the above scanning period. In the final period I of transporting the patient out of the inspection space, the inspection space is illuminated in the same state in the period A.

Since the above successive changes in color within the inspection space appear as colors in the entire environment surrounding the patient 1 who is lying in the inspection space, the patient can perceive such color changes without moving his or her eyes.

Figure 5:
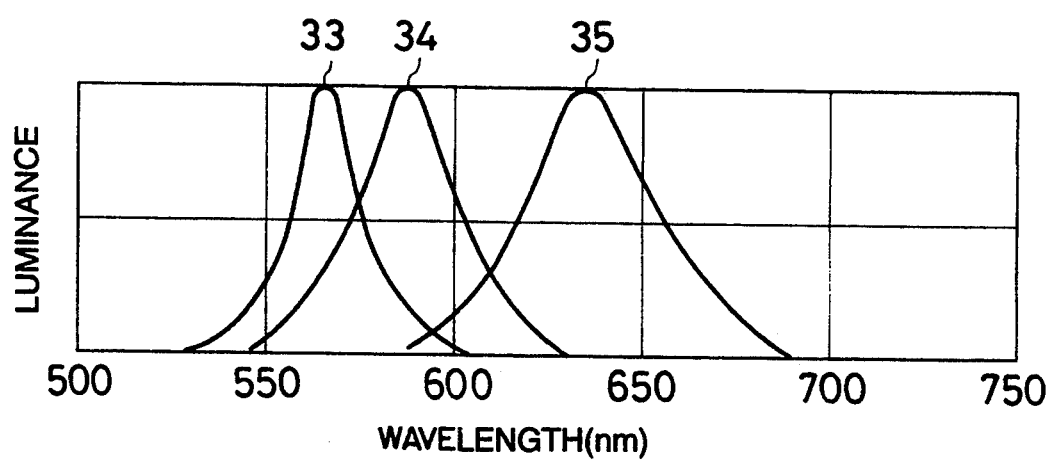
FIG. 5 is a graph showing wavelength distributions of light emitted from planar light emitting diodes in respective colors.

FIG. 5 is a graph showing wavelength distribution of light emitted from planar light emitting diodes. As seen from FIG. 5, the green light emitting diode emits light with a peak at a wavelength of 570 nm, as indicated by a curve 33. The yellow light emitting diode emits light with a peak at a wavelength of 590 nm, as indicated by a curve 34. Further, the red light emitting diode emits light with a peak at a wavelength of 640 nm, as indicated by a curve 35.

Figure 6:
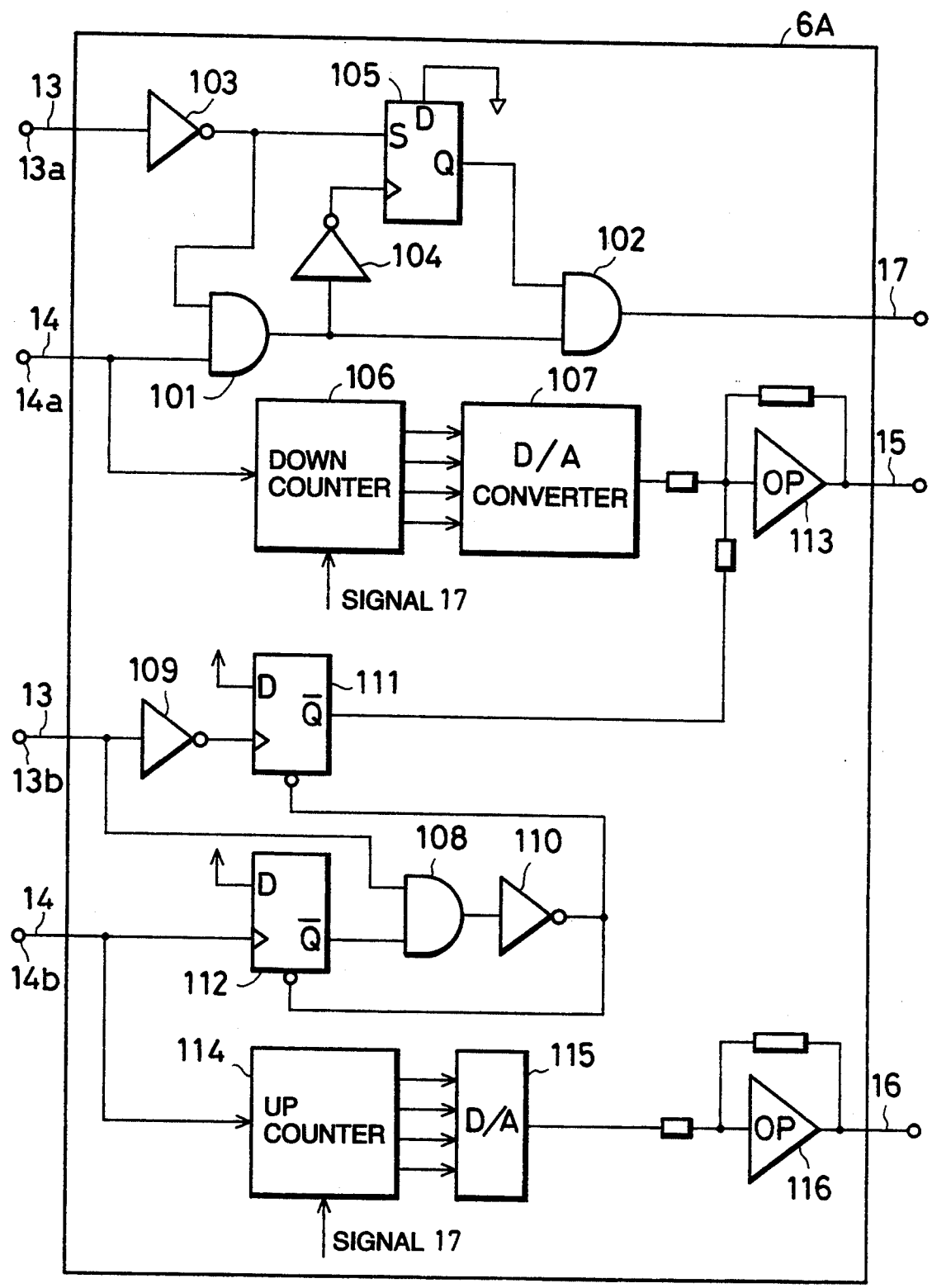
FIG. 6 is a detailed circuit diagram of a signal converting part 6A shown in FIG. 4.

FIG. 6 is a detailed circuit diagram of the signal converting part 6A in FIG. 4. Thus, FIG. 6 shows one example of the circuit for producing, based on the signals 13 and 14 from the control circuit 5, the signals 15, 16, 17 used to drive luminous bodies having natural light spectra (i.e., light emitting diodes).

In FIG. 6, the signal 13 applied from a terminal 13a is supplied via a NOT circuit 103 to an S terminal of a D flip-flop circuit 105 and one input terminal of an AND circuit 101. Further, the signal 14 applied from a terminal 14a is supplied to the other input terminal of the AND circuit 101. An output signal of the AND circuit 101 is supplied to one input terminal of an AND circuit 102. The output signal of the AND circuit 101 is also supplied via a NOT circuit 104 to a clock terminal of the D flip-flop circuit 105. An output signal of the D flip-flop circuit 105 is supplied the other input terminal of the AND circuit 102, and the signal 17 is delivered from an output terminal of the AND circuit 102.

The ten pulse signals 14 applied from the terminal 14a are supplied to a down counter 106, and a 4-bit signal from the down counter 106 is supplied to a D/A converter 107. An output signal of the D/A converter 107 is supplied to an operational amplifier 113. The signal 13 applied from a terminal 13b is supplied to the operational amplifier 113 via a NOT circuit 109 and a D flip-flop circuit 111. Then, the signal 15 is delivered from an output terminal of the operational amplifier 113.

In addition, the signal 13 applied from the terminal 13b is also supplied to one terminal of an AND circuit 108. The signal 14 applied from a terminal 14b is supplied to the other input terminal of the AND circuit 108 through a D flip-flop circuit 112. An output signal of the AND circuit 108 is supplied to the D flip-flop circuits 111 and 112 via a NOT circuit 110. Moreover, the signal 14 applied from the terminal 14b is supplied to an operational amplifier 116 via an up down counter 114 and a D/A converter 115. Then, the signal 16 is delivered from an output terminal of the operational amplifier 116.

Incidentally, the down counter 106 and the up counter 114 are each arranged to be reset by the signal 17.

As explained above, this embodiment is arranged such that depending on the progress of inspection, the intensities of light emitted from the green light emitting diodes, yellow light emitting diodes and red light emitting diodes are changed in such a manner as to visually inform the patient of the progress of inspection based on a change in color, a change in luminance of a color, and change in a combination of colors. Therefore, by letting the patient 1 know the correlation between the above changes and the progress of inspection before starting the inspection, the patient can easily notice a timing to stop breathing and other timing signs, thus making it possible to mitigate a burden imposed on the patient and improve accuracy of the inspection. addition, since the magnetic field generating space is entirely illuminated, a feeling of uneasiness felt by the patient can be suppressed.

In the above arrangement, colors and combinations of colors can be selected freely. The size and layout of the magnet cavity illuminating panel 7 can also be selected freely. Further, the number, size and arrangement of the planar light emitting diodes for each color may be of any desired design.

Figure 7:
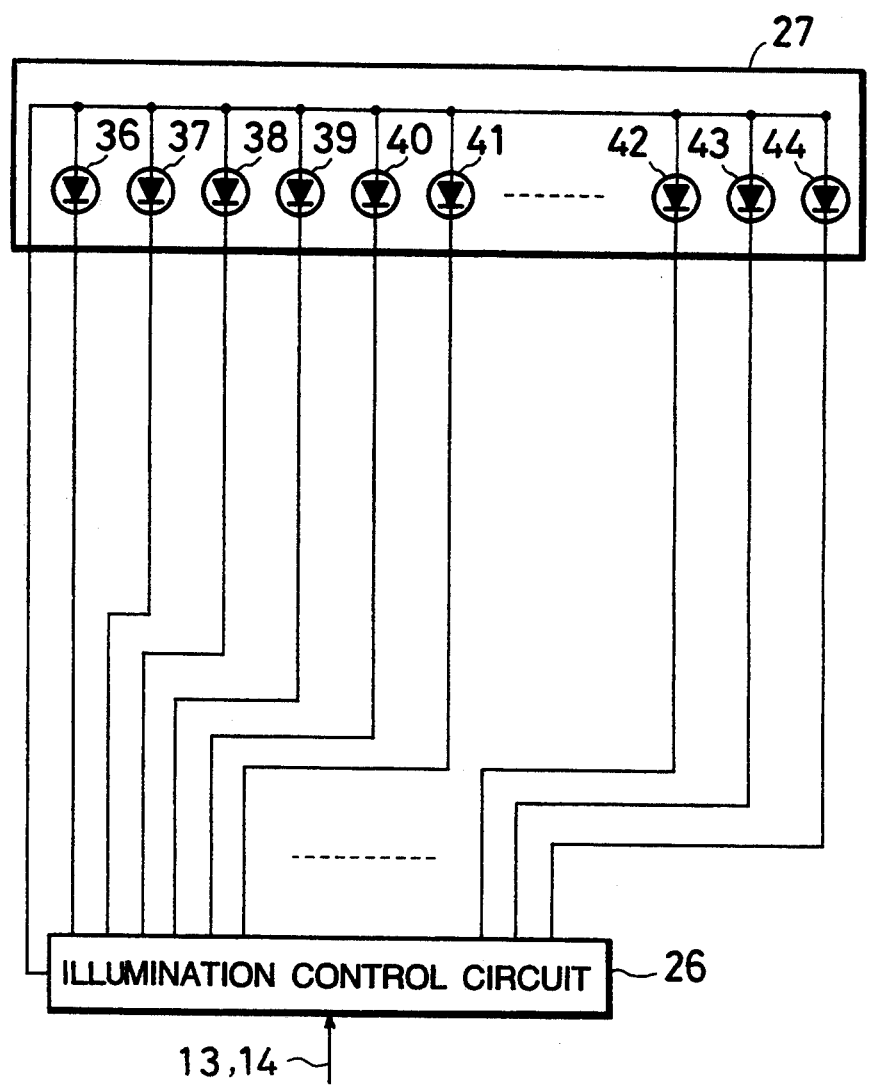
FIG. 7 is a diagram showing details of a connection between an illumination control circuit and a magnet cavity illuminating panel which are used for an illuminating method according to a second embodiment of the present invention.

FIG. 7 is a diagram showing an illumination control circuit 26 and a magnet cavity illuminating panel 27 which are used for an illuminating method according to a second embodiment of the present invention.

In FIG. 7, planar light emitting diodes 36 to 44 are light emitting diodes which are arrayed in a line to have the form of a bar and can emit light in yellow, for instance. The illumination control circuit 26 is arranged to select, based on the control signals 13 and 14, which ones of the light emitting diodes 36 to 44 are to be turned on. Referring to FIG. 3, by way of example, the light emitting diodes 36 to 44 are all turned on in the period A. Then, during the period B, selected successive light emitting diodes in number ten, for instance, are turned off. In the period C, the light emitting diodes are all turned on again. In the next period D, the above selected ten successive light emitting diodes are turned on one by one. Accordingly, in the period C, the light emitting diodes are all turned on again. Thus, in the embodiment of FIG. 7, the progress of inspection is informed to the patient visually in the form of a bar graph in which the number of light spots gradually decreases.

With the second embodiment of the present invention shown in FIG. 7, as explained above, a nuclear magnetic resonance apparatus is provided which can visually inform the patient of the progress of inspection, similarly to the first embodiment. Therefore, by letting the patient know the correlation between the number of the light emitting diodes turned on and the progress of inspection before starting the inspection, the patient can easily notice a timing to stop breathing and other timing signs, thus making it possible to mitigate a burden imposed on the patient and improve accuracy of the inspection. In addition, since the magnetic field generating space is entirely illuminated, a feeling of uneasiness felt by the patient can be suppressed.

Figure 8:
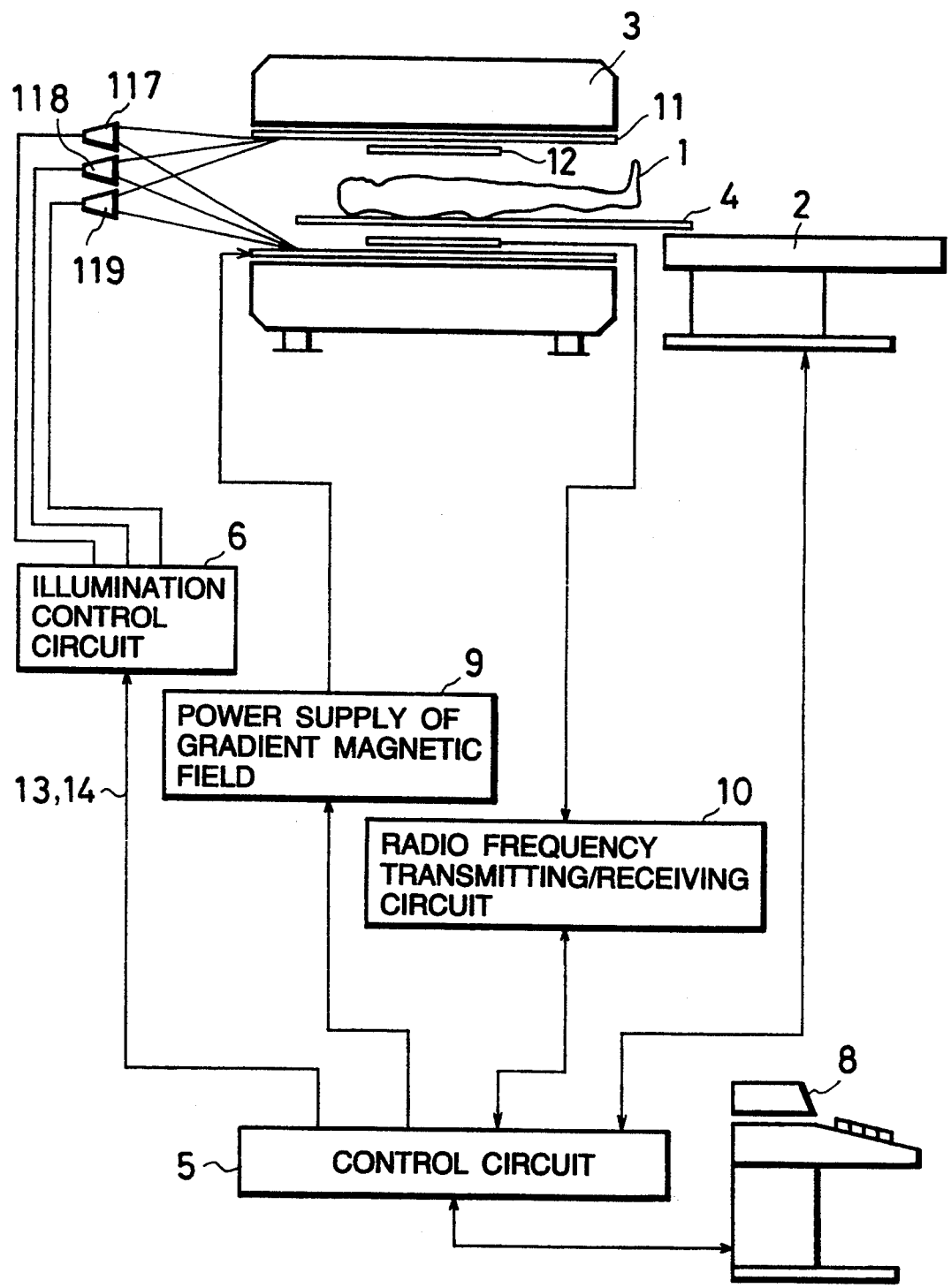
FIG. 8 is a schematic view showing an arrangement of a nuclear magnetic resonance inspection apparatus to which is applied an illuminating method according to a third embodiment of the present invention.

FIG. 8 is a schematic view showing an arrangement of a nuclear magnetic resonance inspection apparatus to which is applied an illuminating method according to a third embodiment of the present invention, in which parts identical to those in the embodiment of FIG. 1 are denoted by the same reference numerals.

In FIG. 8, an illumination lamp 117 is a lamp emitting red light, an illumination lamp 118 is a lamp emitting green light, and an illumination lamp 119 is a lamp emitting blue light. These illumination lamps 117, 118 and 119 are disposed outside the space in which the static magnetic field, the gradient magnetic field and the radio frequency magnetic field are generated. Also, these illumination lamps 117, 118 and 119 are turned on/off by the illumination control circuit 6 and are disposed such that the light is illuminated toward the magnet cavity from the side where the head of patient 1 is positioned. Then, by changing the ratio between the intensities of light emitted from the illumination lamps 117, 118 and 119 in accordance with the progress of inspection, the magnet cavity can be illuminated with light in a desired color.

With the third embodiment of the present invention shown in FIG. 8, as explained above, by letting the patient know the correlation between the colors of light emitted from the illumination lamps 117, 118 and 119 and the progress of inspection before starting the inspection, the patient can easily notice a timing to stop breathing and other timing signs, thus making it possible to mitigate a burden imposed on the patient and improve accuracy of the inspection, similarly to the first embodiment. In addition, since the magnetic field generating space is entirely illuminated in a desired color, a feeling of uneasiness felt by the patient can be suppressed.

Figure 9:
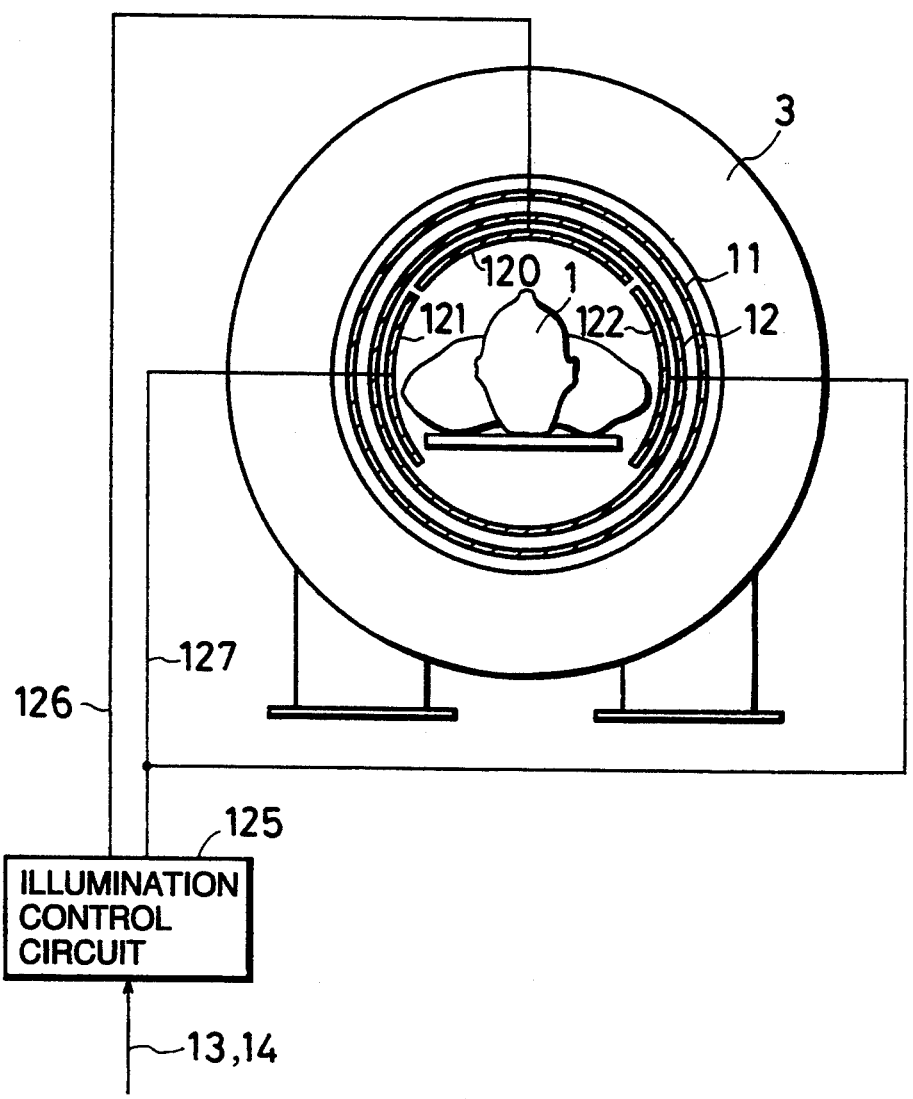
FIG. 9 is a schematic view showing an arrangement of principal parts of a nuclear magnetic resonance inspection apparatus to which is applied an illuminating method according to a fourth embodiment of the present invention.

FIG. 9 is a schematic view an showing arrangement of principal parts of a nuclear magnetic resonance inspection apparatus to which is applied an illuminating method according to a fourth embodiment of the present invention.

Figure 10:
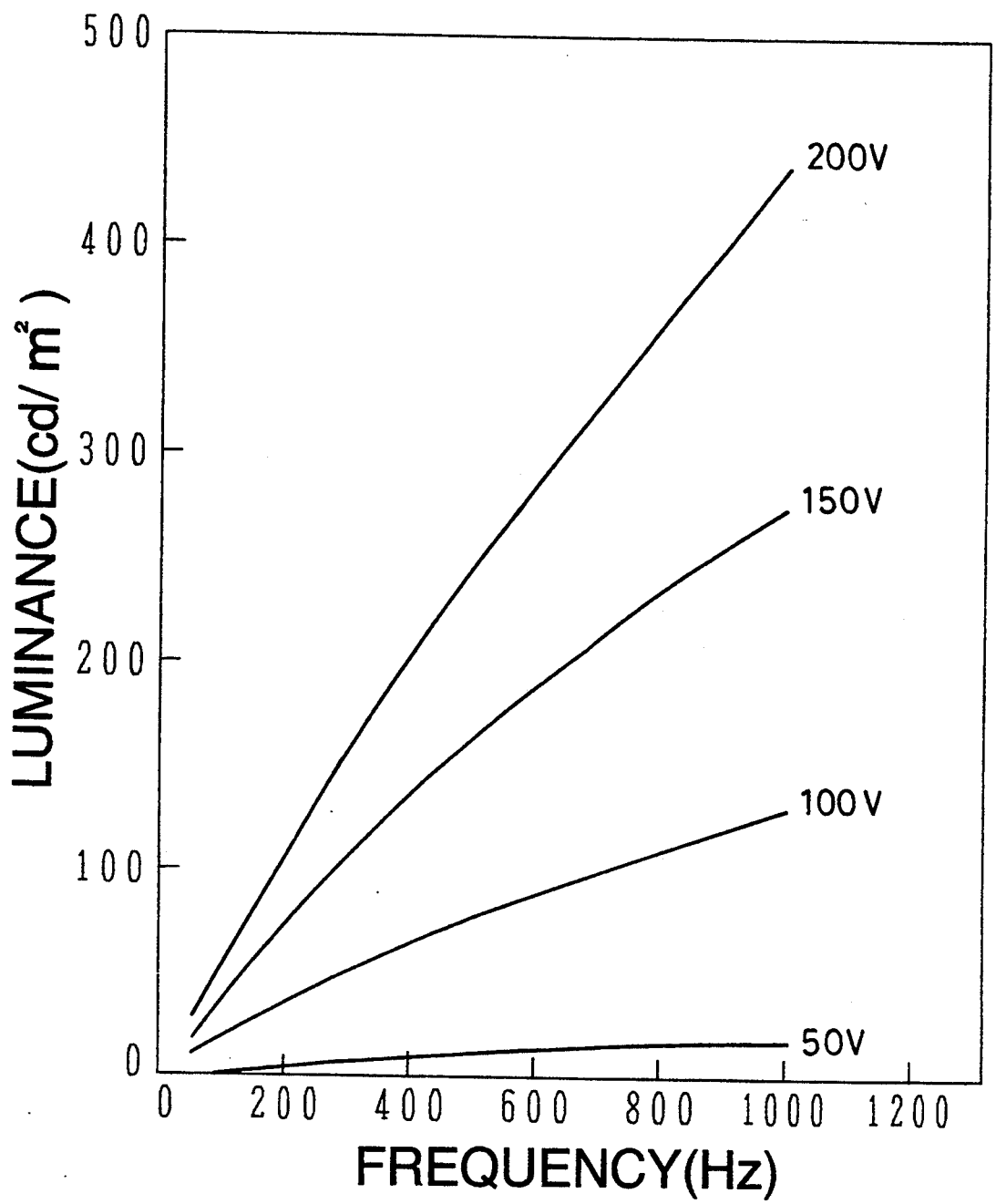
FIG. 10 is a graph showing luminance characteristics of an electroluminescent device.

In FIG. 9, planar luminous bodies 120, 121 and 122 are bonded to an inner wall of the inspection space in which the patient 1 lies face up. These planar luminous bodies 120, 121 and 122 are each an electroluminescent lamp utilizing a phenomenon wherein semiconductor materials emit light upon an electric field being applied thereto. By way of example, the planar luminous body 120 emits light in yellow and the planar luminous bodies 121 and 122 emit light in green. The intensity of light emitted from the planar luminous body 120 is controlled by a control signal 126 from an illumination control circuit 125, while the intensities of light emitted from the planar luminous bodies 121 and 122 are controlled by a control signal 127 from the illumination control circuit 125. FIG. 10 is a graph showing luminance characteristics of an electroluminescent device, in which the vertical axis represents luminance (cd/m$^2$) and the horizontal axis represents frequency. Characteristic curves indicate the cases where the voltage applied to the device is 50 V, 100 V, 150 V and 200 V. As can be seen from FIG. 10, the luminance of the electroluminescent device can be controlled with the applied voltage and frequency.

Figure 11:
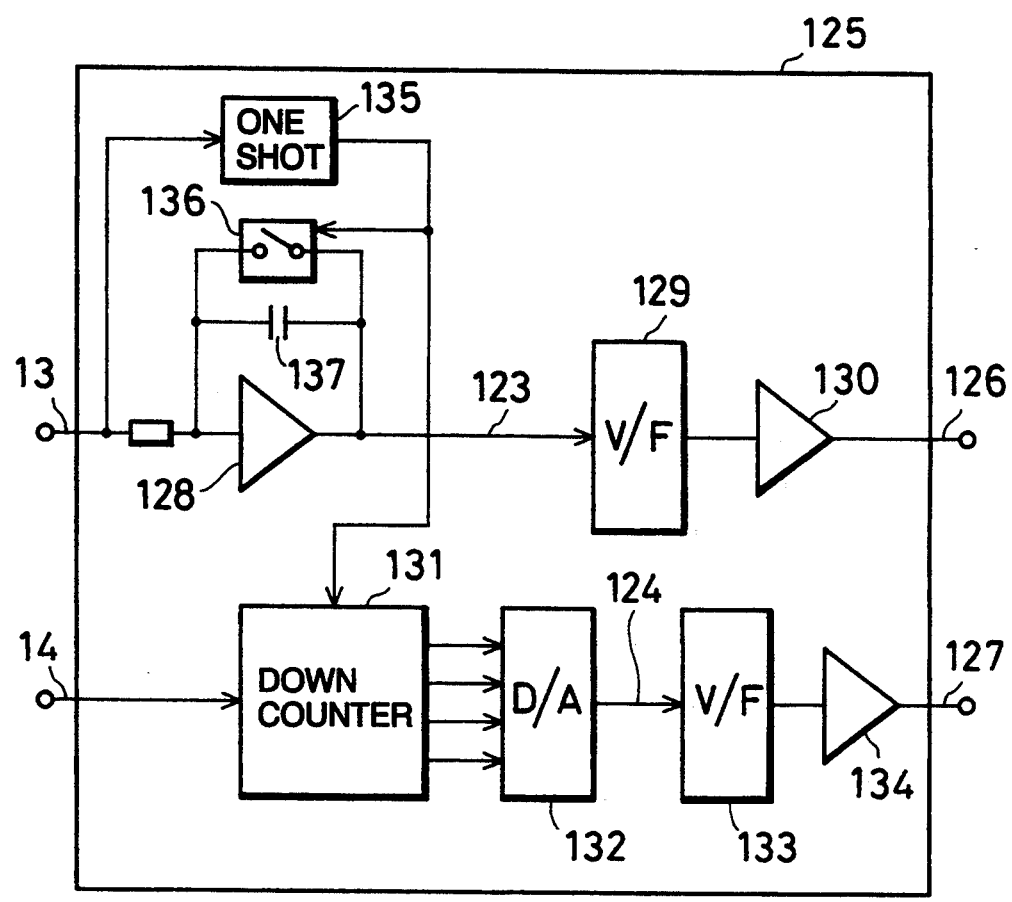
FIG. 11 is a detailed circuit diagram of an illumination control circuit 125 shown in FIG. 9.

FIG. 11 is a detailed circuit diagram of the illumination control circuit 125 shown in FIG. 9. Referring to FIG. 11, the signal 13 is supplied to an input terminal of an integrating circuit 128, one electrode of a capacitor 137, and one terminal of a switch 136. The other terminal of the switch 136 and the other electrode of the capacitor 137 are connected to an output terminal of the integrating circuit 128. The signal 13 is also supplied to a one-shot multivibrator 135, an output signal of which is supplied to the switch 136 and a down counter 131. Then, an output signal 123 of the integrating circuit 128 is supplied to an amplifier 130 via a voltage/frequency converter 129, and the signal 126 amplified to an amplitude of 200 V is delivered from an output terminal of the amplifier 130.

On the other hand, the signal 14 is supplied to the down counter 131. An output signal of the down counter 131 is supplied to a D/A converter 132. Then, an output signal 124 of the D/A converter 132 is supplied to an amplifier 134 via a voltage/frequency converter 133, and the signal 127 amplified to an amplitude of 200 V is delivered from an output terminal of the amplifier 134.

Figure 12:
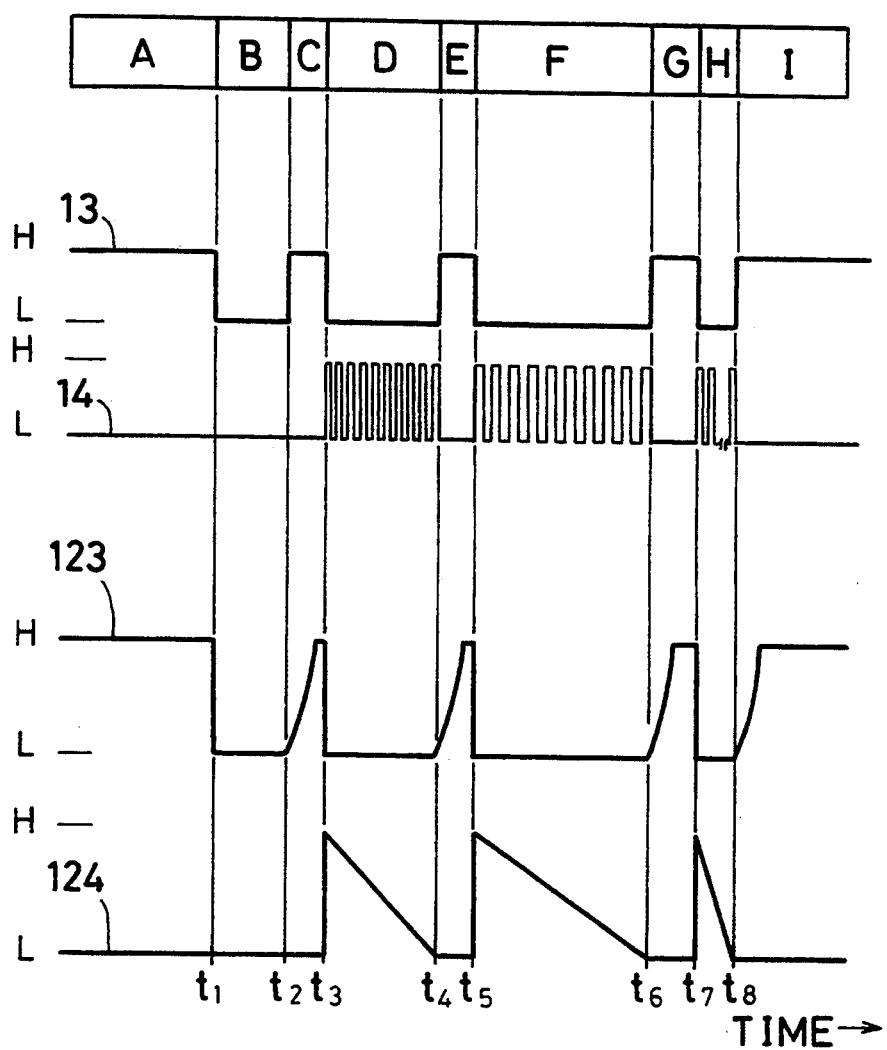
FIG. 12 is a timing chart showing the relationship between the progress of inspection and operation of the illumination control circuit in the fourth embodiment of the present invention.
Figure 13:
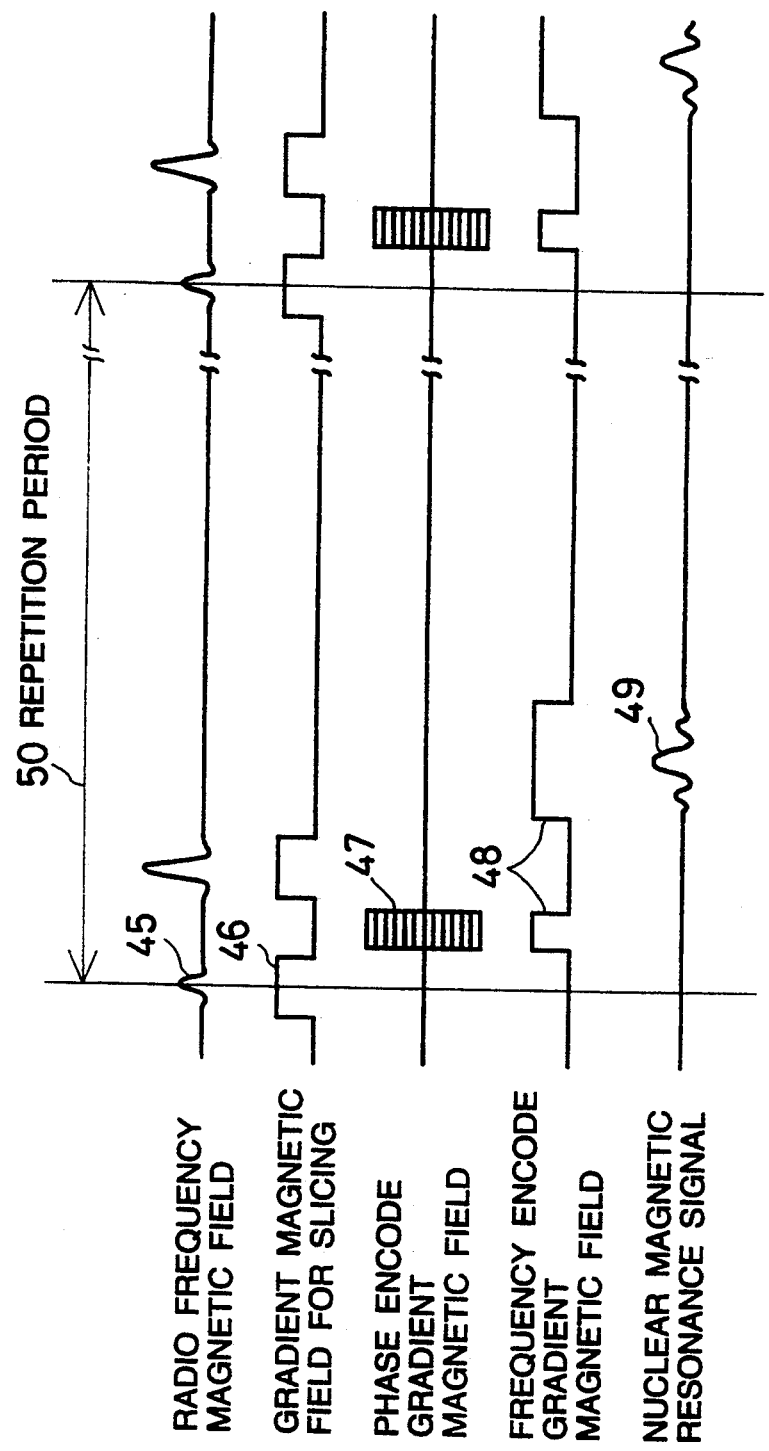
FIG. 13 is a sequence diagram for explaining a general operation of the nuclear magnetic resonance inspection apparatus.

FIG. 12 is a timing chart showing the relationship between the progress of inspection and operation of the illumination control circuit 125 in the above fourth embodiment.

Referring to FIGS. 11 and 12, during a period A until time t1, the signal 13 takes an "H" level, the signal 14 takes an "L" level, the signal 123 takes an "H" level, and the signal 124 takes an "L" level. In other words, the planar luminous body 120 is turned on and the planar luminous bodies 121 and 122 are turned off. Then, in a period B until time t2, the signal 13 turns to an "L" level and the signal 123 turns to an "L" level. In other words, the planar luminous bodies 120, 121 and 122 are all turned off. In a next period C from time t2 to time t3, the signal 13 turns to an "H" level and the level of the output signal 128 of the integrating circuit 128 gradually increases. In other words, the intensity of light emitted from the planar luminous body 120 gradually increases.

In a period D, the signal 13 turns from an "H" to "L" level at time t3. Upon this level change, the signal from the one-shot multivibrator 185 is supplied to the switch 136, whereby the switch 186 is turned on and the signal 128 turns from an "H" to "L" level. The signal from the one-shot multivibrator 185 is also supplied to the down counter 131 which starts counting down in response to the signal 14. Accordingly, the signal 124 turns to an "H" level at time t3 and then gradually decreases toward time t4 before reaching an "L" level. In other words, during the period D, the planar luminous body 120 is turned off, while the intensities of light emitted from the planar luminous bodies 121 and 122 gradually decrease.

Operation of the circuit in periods E and G are similar to that in the period C and hence will not be described. Also, operation of the circuit in periods F and H are similar to that in the period D and hence will not be described.

With the fourth embodiment of the present invention shown in FIG. 9, as explained above, by letting the patient know the correlation between the colors of light emitted from the planar luminous bodies 120, 121 and 122 and the progress of inspection before starting the inspection, the patient can easily notice a timing to stop breathing and other timing signs, thus making it possible to mitigate a burden imposed on the patient and improve accuracy of the inspection, similarly to the first embodiment. In addition, since the magnetic field generating space is entirely illuminated, a feeling of uneasiness felt by the patient can be suppressed.

It should be noted that, in the above embodiments, the number of light emitting diodes or electroluminescent lamps may be increased so as to display desired characters, patterns or the like. In this case, it is also possible to observe a slice image of the patient's brain when characters or patterns are displayed.

Further, as the luminous bodies in the present invention, optical fibers or plasma luminous bodies may also be used other than the light emitting diodes and electroluminescent lamps in the foregoing embodiments.

With the illuminating method in nuclear magnetic resonance inspection according to the present invention, as fully described above, light emitting means for informing messages to a patient is disposed in a space in which a static magnetic field, a gradient magnetic field and a radio frequency magnetic field are generated, and a light emitting operation of the light emitting means is controlled in relation to a control operation of magnetic field generation control means. It is thus possible to clearly inform the patient of the progress of inspection in a visual manner and make the patient easily notice a timing to stop breathing and other timing signs, while mitigating a burden imposed on the patient and improving accuracy of the inspection. Additionally, since the magnetic field generating space is entirely illuminated by the light from the light emitting means, a feeling of uneasiness felt by the patient can be suppressed.

What is claimed is:

1. An illuminating method in nuclear magnetic resonance inspection, the method comprising the steps of:
   generating a static magnetic field, a gradient magnetic field, and a radio frequency magnetic field in a predetermined space in which an object of inspection is disposed;
   detecting a nuclear magnetic resonance signal generated by the object of inspection in response to the static magnetic field, the gradient magnetic field, and the radio frequency magnetic field;
   controlling generation of the static magnetic field, the gradient magnetic field, and the radio frequency magnetic field, and detection of the nuclear magnetic resonance signal to perform nuclear magnetic resonance inspection of the object of inspection;
   illuminating with light the space in which the object of inspection is disposed;
   changing an intensity of the light illuminating the space in which the object of inspection is disposed during performance of the nuclear magnetic resonance inspection so as to indicate progress of the nuclear magnetic resonance inspection to the object of inspection;
   arithmetically processing the detected nuclear magnetic resonance signal to obtain a tomographic image of the object of inspection; and
   displaying the tomographic image.

2. A method according to claim 1, wherein the step of changing the intensity of the light includes reducing the intensity of the light in a continuous manner from a start of the nuclear magnetic resonance inspection to an end of the nuclear magnetic resonance inspection.

3. A method according to claim 1, wherein the step of changing the intensity of the light includes increasing the intensity of the light in a continuous manner from a start of the nuclear magnetic resonance inspection to an end of the nuclear magnetic resonance inspection.

4. A method according to claim 1, wherein the step of changing the intensity of the light includes reducing the intensity of the light in a stepwise manner from a start of the nuclear magnetic resonance inspection to an end of the nuclear magnetic resonance inspection.

5. A method according to claim 1, wherein the step of changing the intensity of the light includes increasing the intensity of the light in a stepwise manner from a start of the nuclear magnetic resonance inspection to an end of the nuclear magnetic resonance inspection.

6. An illuminating apparatus in nuclear magnetic resonance inspection, the apparatus comprising:
   magnetic field generating means for generating a static magnetic field, a gradient magnetic field, and a radio frequency magnetic field in a predetermined space in which an object of inspection is disposed;
   detecting means for detecting a nuclear magnetic resonance signal generated by the object of inspection in response to the static magnetic field, the gradient magnetic field, and the radio frequency magnetic field;

control means for controlling the magnetic field generating means and the detecting means to perform nuclear magnetic resonance inspection of the object of inspection;

illuminating means for illuminating with light the space in which the object of inspection is disposed;

indicating means for changing an intensity of the light illuminating the space in which the object of inspection is disposed during performance of the nuclear magnetic resonance inspection so as to indicate progress of the nuclear magnetic resonance inspection to the object of inspection;

processing means for arithmetically processing the detected nuclear magnetic resonance signal to obtain a tomographic image of the object of inspection; and display means for displaying the tomographic image.

7. An apparatus according to claim 6, wherein the indicating means includes means for reducing the intensity of the light in a continuous manner from a start of the nuclear magnetic resonance inspection to an end of the nuclear magnetic resonance inspection.

8. An apparatus according to claim 6, wherein the indicating means includes means for increasing the intensity of the light in a continuous manner from a start of the nuclear magnetic resonance inspection to an end of the nuclear magnetic resonance inspection.

9. An apparatus according to claim 6, wherein the indicating means includes means for reducing the intensity of the light in a stepwise manner from a start of the nuclear magnetic resonance inspection to an end of the nuclear magnetic resonance inspection.

10. An apparatus according to claim 6, wherein the indicating means includes means for increasing the intensity of the light in a stepwise manner from a start of the nuclear magnetic resonance inspection to an end of the nuclear magnetic resonance inspection.

11. An apparatus according to claim 6, wherein the illuminating means includes a plurality of light emitting diodes disposed in the space in which the object of inspection is disposed.

12. An apparatus according to claim 6, wherein the illuminating means includes a plurality of electroluminescent lamps disposed in the space in which the object of inspection is disposed.

13. An apparatus according to claim 6, wherein the illuminating means includes a plurality of lamps disposed outside the space in which the object of inspection is disposed.

14. An illuminating method in nuclear magnetic resonance inspection, the method comprising the steps of:

generating a static magnetic field, a gradient magnetic field, and a radio frequency magnetic field in a predetermined space in which an object of inspection is disposed;

detecting a nuclear magnetic resonance signal generated by the object of inspection in response to the static magnetic field, the gradient magnetic field, and the radio frequency magnetic field;

controlling generation of the static magnetic field, the gradient magnetic field, and the radio frequency magnetic field, and detection of the nuclear magnetic resonance signal to perform nuclear magnetic resonance inspection of the object of inspection;

illuminating with light the space in which the object of inspection is disposed;

changing a color of the light illuminating the space in which the object of inspection is disposed during performance of the nuclear magnetic resonance inspection so as to indicate progress of the nuclear magnetic resonance inspection to the object of inspection;

arithmetically processing the detected nuclear magnetic resonance signal to obtain a tomographic image of the object of inspection; and displaying the tomographic image.

15. A method according to claim 14, wherein the step of changing the color of the light includes changing the color of the light in a stepwise manner from a start of the nuclear magnetic resonance inspection to an end of the nuclear magnetic resonance inspection.

16. An illuminating apparatus in nuclear magnetic resonance inspection, the apparatus comprising:

magnetic field generating means for generating a static magnetic field, a gradient magnetic field, and a radio frequency magnetic field in a predetermined space in which an object of inspection is disposed;

detecting means for detecting a nuclear magnetic resonance signal generated by the object of inspection in response to the static magnetic field, the gradient magnetic field, and the radio frequency magnetic field;

control means for controlling the magnetic field generating means and the detecting means to perform nuclear magnetic resonance inspection of the object of inspection;

illuminating means for illuminating with light the space in which the object of inspection is disposed;

indicating means for changing a color of the light illuminating the space in which the object of inspection is disposed during performance of the nuclear magnetic resonance inspection so as to indicate progress of the nuclear magnetic resonance inspection to the object of inspection;

processing means for arithmetically processing the detected nuclear magnetic resonance signal to obtain a tomographic image of the object of inspection; and display means for displaying the tomographic image.

17. An apparatus according to claim 16, wherein the indicating means includes means for changing the color of the light in a stepwise manner from a start of the nuclear magnetic resonance inspection to an end of the nuclear magnetic resonance inspection.

18. An illuminating method in nuclear magnetic resonance inspection, the method comprising the steps of:

generating a static magnetic field, a gradient magnetic field, and a radio frequency magnetic field in a predetermined space in which an object of inspection is disposed;

detecting a nuclear magnetic resonance signal generated by the object of inspection in response to the static magnetic field, the gradient magnetic field, and the radio frequency magnetic field;

controlling generation of the static magnetic field, the gradient magnetic field, and the radio frequency magnetic field, and detection of the nuclear magnetic resonance signal to perform nuclear magnetic resonance inspection of the object of inspection;

illuminating with light the space in which the object of inspection is disposed, the light having a first color at a start of the nuclear magnetic resonance inspection;

changing the color of the light illuminating the space in which the object of inspection is disposed from the first color to a second color during performance of the nuclear magnetic resonance inspection so as to indicate progress of the nuclear magnetic resonance inspection to the object of inspection;

arithmetically processing the detected nuclear magnetic resonance signal to obtain a tomographic image of the object of inspection; and displaying the tomographic image.

19. A method according to claim 18, wherein the step of changing the color of the light includes changing the color of the light from the first color to the second color in a stepwise manner from the start of the nuclear magnetic resonance inspection to an end of the nuclear magnetic resonance inspection.

20. An illuminating apparatus in nuclear magnetic resonance inspection, the apparatus comprising:

magnetic field generating means for generating a static magnetic field, a gradient magnetic field, and a radio frequency magnetic field in a predetermined space in which an object of inspection is disposed;

detecting means for detecting a nuclear magnetic resonance signal generated by the object of inspection in response to the static magnetic field, the gradient magnetic field, and the radio frequency magnetic field;

control means for controlling the magnetic field generating means and the detecting means to perform nuclear magnetic resonance inspection of the object of inspection;

illuminating means for illuminating with light the space in which the object of inspection is disposed, the light having a first color at a start of the nuclear magnetic resonance inspection;

indicating means for changing the color of the light illuminating the space in which the object of inspection is disposed from the first color to a second color during performance of the nuclear magnetic resonance inspection so as to indicate progress of the nuclear magnetic resonance inspection to the object of inspection;

processing means for arithmetically processing the detected nuclear magnetic resonance signal to obtain a tomographic image of the object of inspection; and display means for displaying the tomographic image.

21. An apparatus according to claim 20, wherein the indicating means includes means for changing the color of the light from the first color to the second color in a stepwise manner from the start of the nuclear magnetic resonance inspection to an end of the nuclear magnetic resonance inspection.

22. An apparatus according to claim 20, wherein the illuminating means includes a plurality of light emitting diodes disposed in the space in which the object of inspection is disposed.

23. An apparatus according to claim 20, wherein the illuminating means includes a plurality of electroluminescent lamps disposed in the space in which the object of inspection is disposed.

24. An apparatus according to claim 20, wherein the illuminating means includes a plurality of lamps disposed outside the space in which the object of inspection is disposed.

* * * * *